US011879182B2

(12) United States Patent
Tatsumi

(10) Patent No.: US 11,879,182 B2
(45) Date of Patent: Jan. 23, 2024

(54) TIN ALLOY PLATING SOLUTION

(71) Applicant: MITSUBISHI MATERIALS CORPORATION, Tokyo (JP)

(72) Inventor: Koji Tatsumi, Sanda (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 18/036,750

(22) PCT Filed: Nov. 12, 2021

(86) PCT No.: PCT/JP2021/041786
§ 371 (c)(1),
(2) Date: May 12, 2023

(87) PCT Pub. No.: WO2022/113787
PCT Pub. Date: Jun. 2, 2022

(65) Prior Publication Data
US 2023/0323554 A1  Oct. 12, 2023

(30) Foreign Application Priority Data
Nov. 25, 2020 (JP) .................................. 2020-194825

(51) Int. Cl.
*C25D 3/60* (2006.01)
(52) U.S. Cl.
CPC ...................... *C25D 3/60* (2013.01)
(58) Field of Classification Search
None
See application file for complete search history.

(56) References Cited

U.S. PATENT DOCUMENTS

| | | | |
|---|---|---|---|
| 5,698,087 A * | 12/1997 | Bokisa | C25D 3/60 205/253 |
| 6,372,117 B1 | 4/2002 | Tamura | |
| 2015/0267310 A1 | 9/2015 | Ikumoto et al. | |
| 2020/0378024 A1 | 12/2020 | Watanabe et al. | |
| 2021/0040636 A1 | 2/2021 | Watanabe et al. | |

FOREIGN PATENT DOCUMENTS

| | | | |
|---|---|---|---|
| CN | 1742118 A * | 3/2006 | ............ C25D 3/32 |
| JP | H11-001792 A | 1/1999 | |
| JP | 2000-100850 A | 4/2000 | |
| JP | 2001-181889 A | 7/2001 | |
| JP | 2015-193916 A | 11/2015 | |
| JP | 2019-077949 A | 5/2019 | |
| JP | 2019-163507 A | 9/2019 | |

(Continued)

OTHER PUBLICATIONS

Machine translation of Koji et al. WO 2019/181906 A1 (Year: 2019).*

(Continued)

*Primary Examiner* — Wojciech Haske
(74) *Attorney, Agent, or Firm* — Locke Lord LLP

(57) ABSTRACT

The tin alloy plating solution of the present invention includes (A) a soluble salt including at least a stannous salt, (B) a soluble salt of a metal nobler than tin, (C) an alkane sulfonic acid including 9 to 18 carbon atoms in a molecule or a salt thereof, (D) a non-ionic surfactant including one or more phenyl groups in a molecule, and (E) a leveling agent.

4 Claims, 1 Drawing Sheet

(56) References Cited

FOREIGN PATENT DOCUMENTS

JP        6635139 B2    1/2020
WO    WO-2019181906 A1 *  9/2019   ............... C25D 3/32

OTHER PUBLICATIONS

Machine translation of Eikawa et al. CN 1742118 A (Year: 2006).*
International Search Report dated Jan. 18, 2022, issued for PCT/JP2021/041786 and English translation thereof.
Office Action dated Apr. 18, 2022, issued for JP2020-194825 and machine English translation thereof.
Notice of Allowance dated Nov. 28, 2023, issued for KR10-2023-7012888 and machine English translation thereof.

* cited by examiner

TIN ALLOY PLATING SOLUTION

TECHNICAL FIELD

The present invention relates to a tin alloy plating solution for producing bumps which are to be tin alloy protruding electrodes on a circuit substrate when mounting a semiconductor integrated circuit chip on the circuit substrate.

The present application claims priority on Japanese Patent Application No. 2020-194825 filed on Nov. 25, 2020, the content of which is incorporated herein by reference.

BACKGROUND ART

In the related art, there is disclosed a method for forming a tin or tin alloy plating deposition layer on a substrate using a tin or tin alloy plating solution for plating a substrate in which vias having a plurality of via diameters are present, and the tin or tin alloy solution includes (A) a soluble salt including at least a stannous salt, (B) an acid or a salt thereof selected from organic acids and inorganic acids, (C) a surfactant, (D) a leveling agent, and (E) an additive (for example, refer to Patent Document 1 (claim 1, and paragraphs 0020, 0043, and 0044)). In this method for forming a tin or tin alloy plating deposition layer, the surfactant is a compound (C1) represented by General Formula (1) or a compound (C2) represented by General Formula (2).

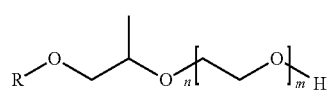

(1)

In Formula (1), R is an alkyl group having 7 to 13 carbon atoms, m is 8 to 11, n is 1 to 3, and m is different from n.

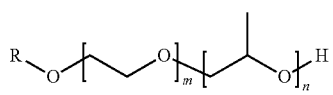

(2)

In Formula (2), R is an alkyl group having 9 to 13 carbon atoms, in is 6 to 8, n is 2 to 3, and m is different from n.

The leveling agent (D) is added to form a uniform and dense plated film and to smoothen the plated film. Two types of a first leveling agent (D-1) and a second leveling agent (D-2) are used in order to improve the via-filling property and suppress the generation of voids. Examples of the first leveling agent (D-1) include one or two or more selected from the group consisting of aliphatic aldehydes, aromatic aldehydes, aliphatic ketones, and aromatic ketones and examples of the second leveling agent (D-2) include α,β-unsaturated carboxylic acids or amides and salts thereof. Examples of the aromatic ketones include benzalacetone, 2-chloroacetophenone, 3-chloroacetophenone, 4-chloroacetophenone, 2,4-dichloroacetophenone, 2,4,6-trichloroacetophenone, and the like.

In the method for forming a tin or tin alloy plated deposition layer configured in this manner, by the surfactants (C1, C2) having specific non-ionic structures in which each of in of the polyoxypropylene alkyl group and n of the polyoxyethylene group in General Formula (1) and General Formula (2) is set in a predetermined range, it is possible to suppress the precipitation of Sn ions during plating and to plate the surface to be plated in a favorable manner. In particular, using this plating solution, in the case of patterns with different bump diameters, whether the bump diameter is large or small, the via-filling property for the vias on the substrate is excellent and the heights of the formed bumps are uniform. It is considered that this is because the polarization resistance is increased.

On the other hand, there is disclosed a method for forming low-melting point metal bumps on a semiconductor chip or a package by electroplating (for example, refer to Patent Document 2 (claim 1, paragraph [0013], and paragraph [0019])). In this method for forming low-melting point metal bumps, as the electroplating bath, a silver-based alloy plating bath is used which contains the following components: (a) 5 to 300 g/l of at least one type of alkane sulfonic acid ions or alkanol sulfonic acid ions, (b) 0.01 to 10 g/l of Ag ions, (c) 0.1 to 40 g/L of one type of metal ions selected from $Sn^{2+}$ and $Bi^{3+}$, (d) 0.01 to 40 g/l of one type of sulfur-containing compound, and (e) 0.5 to 30 g/l of a non-ionic surfactant, and a current is applied thereto in the form of repeated rectangular pulse waves or multi-stage rectangular waves. In addition, it is necessary to use an alkane sulfonic acid or an alkanol sulfonic acid as an acidic component. Preferable examples of alkane sulfonic acids or alkanol sulfonic acids include methane sulfonic acid, ethane sulfonic acid, and the like.

With the method for forming low-melting point metal bumps configured in this manner, it is possible to form bumps having a favorable shape without using lead. Since the bumps obtained by this method for forming low-melting point metal bumps do not include lead, erroneous operations such as semiconductor memory elements being reversed due to α-rays are not caused and there is also an advantage from the standpoint of environmental pollution. Accordingly, this method for forming low-melting point metal bumps is extremely advantageous as a method of forming bumps on semiconductor chips and packages by electroplating.

PRIOR ART DOCUMENTS

Patent Document

Patent Document 1: Japanese Patent No. 6635139 (B)
Patent Document 2: Japanese Unexamined Patent Application, First Publication No. 2000-100850 (A)

DISCLOSURE OF INVENTION

Problems to be Solved by the Invention

However, in the method for forming a tin or tin alloy plated deposition layer shown in Patent Document 1 described above, the concentration of an aromatic carbonyl compound (benzalacetone, cinnamic acid, cinnamaldehyde, benzaldehyde, or the like) or the like, which is a leveling agent to be added to form a uniform and dense plated film and to smoothen the plated film, decreases due to the electrolysis in the electroplating, thus, the analysis management and replenishment work to maintain the concentration are complicated and decomposition products of the leveling agent accumulate in the plating solution to cause defects which deteriorate the plating property. In addition, in the method for forming low-melting point metal bumps disclosed in Patent Document 2, an alkane sulfonic acid or an alkanol sulfonic acid is used as the acidic component. An alkane sulfonic acid or an alkanol sulfonic acid is a methane sulfonic acid or an ethane sulfonic acid having a small number of carbon atoms and is highly water-soluble. Therefore, a methane sulfonic acid or an ethane sulfonic acid has a function as a free acid, but does not have a function as a leveling agent for smoothening the plated film.

An object of the present invention is to provide a tin alloy plating solution able to form a uniform and dense plated film and to smoothen the plated film without using an aromatic carbonyl compound (benzalacetone, cinnamic acid, cinnamaldehyde, benzaldehyde, and the like) as a leveling agent and without replenishing the leveling agent for a long period of time during electroplating.

Solutions for Solving the Problems

A tin alloy plating solution that is one aspect of the present invention (referred to below as "the tin alloy plating solution of the present invention") includes (A) a soluble salt or oxide including at least a stannous salt, (B) a soluble salt or oxide of a metal nobler than tin, (C) a leveling agent consisting of an alkane sulfonic acid including 9 to 18 carbon atoms in a molecule or a salt thereof, (D) a non-ionic surfactant including one or more phenyl groups, and (E) a free acid.

In the above aspect, an amount of the alkane sulfonic acid or salt thereof may be 0.01 g/L to 1 g/L.

In the above aspect, a number of carbon atoms in a molecule of the alkane sulfonic acid or salt thereof may be 10 to 17.

In the above aspect, the alkane sulfonic acid may be a secondary alkane sulfonic acid or a salt thereof.

In the above aspect, the metal nobler than tin may be silver or copper.

Effects of Invention

The tin alloy plating solution of the present invention includes (A) a soluble salt or oxide including at least a stannous salt, (B) a soluble salt or oxide of a metal nobler than tin, (C) a leveling agent consisting of an alkane sulfonic acid including 9 to 18 carbon atoms in the molecule or a salt thereof, (D) a non-ionic surfactant including one or more phenyl groups in the molecule, and (E) a free acid, thus, it is possible to form a uniform and dense plated film and to smoothen the plated film without using an aromatic carbonyl compound (benzalacetone, cinnamic acid, cinnamaldehyde, benzaldehyde, and the like) as a leveling agent and without replenishing the leveling agent for a long period of time during electroplating. When an alkane sulfonic acid in which the number of carbon atoms is 8 or less or a salt thereof (for example, a methane sulfonic acid or an ethane sulfonic acid) is used as the leveling agent, the alkane sulfonic acid is highly water soluble and is not adsorbed to the surface of the object to be plated, thus, there is no action as a leveling agent and no effect of smoothening the plated film. In addition, when an alkane sulfonic acid in which the number of carbon atoms is 19 or more or salt thereof is used as a leveling agent, since the water solubility of the alkane sulfonic acid or salt thereof is low, it is not possible to dissolve the alkane sulfonic acid or salt thereof in the plating solution. In contrast, in the present invention, an alkane sulfonic acid in which the number of carbon atoms is 9 to 18 or a salt thereof is used as a leveling agent, thus, an interaction occurs in which the non-ionic surfactant containing phenyl group solubilizes the alkane sulfonic acid in the plating solution. As a result, a smooth tin alloy plating is obtained due to the specific adsorption of the alkane sulfonic acid in which the number of carbon atoms is 9 to 18 or salt thereof and the non-ionic surfactant containing phenyl group to the in surface.

When the amount of the alkane sulfonic acid or salt thereof is 0.01 g/L to 1 g/L, the non-ionic surfactant containing phenyl group is able to easily solubilize the alkane sulfonic acid, and the effect that the interaction easily occurs is obtained.

When the number of carbon atoms in the molecule of the alkane sulfonic acid or salt thereof is 10 to 17, the interaction that the non-ionic surfactant containing phenyl group solubilizes the alkane sulfonic acid or salt thereof in the liquid occurs more quickly. As a result, a smoother tin alloy plating is obtained due to the specific adsorption of the alkane sulfonic acid in which the number of carbon atoms is 10 to 17 or salt thereof and the surfactant containing phenyl group to the tin surface.

When the alkane sulfonic acid is a secondary alkane sulfonic acid or a salt thereof, the solubility in the plating solution is slightly improved as compared with a primary alkane sulfonic acid or a salt thereof, while the effect is obtained that the interaction of the non-ionic surfactant containing phenyl group to dissolve the alkane sulfonic acid occurs more quickly.

When the metal that is nobler than tin is silver or copper, the solder wettability, mounting strength, bendability, and reflowing property are excellent and the effect that whiskers are not easily generated is obtained.

EMBODIMENTS FOR CARRYING OUT THE INVENTION

Figure 1:
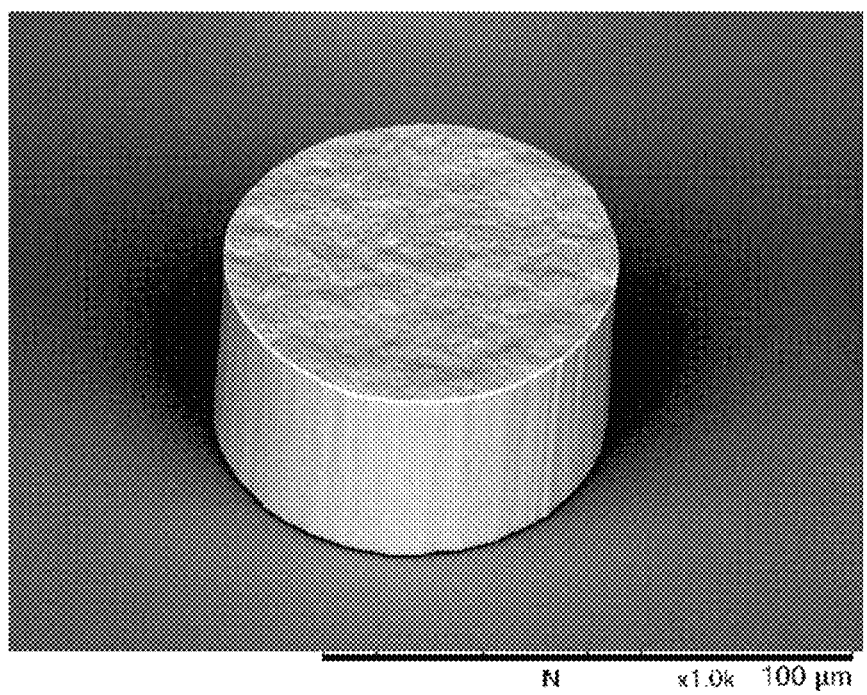
FIG. 1 is a scanning electron micrograph showing the external appearance of a bump in Example 3.

Next, a description will be given of an embodiment for carrying out the present invention based on the drawings. The tin alloy plating solution of the present invention includes (A) a soluble salt or oxide including at least a stannous salt, (B) a soluble salt or oxide of a metal nobler than tin, (C) a leveling agent consisting of an alkane sulfonic acid including 9 to 18 carbon atoms in the molecule or a salt thereof, (D) a non-ionic surfactant including one or more phenyl groups, and (E) a free acid.

[Tin Alloy]

The tin alloy made from the tin alloy plating solution of the present embodiment is an alloy of tin (Sn) and a predetermined metal selected from silver (Ag), copper (Cu), gold (Au), and bismuth (Bi) and examples thereof include binary alloys such as Sn—Ag alloys, Sn—Cu alloys, Sn—Au alloys, and Sn—Bi alloys and ternary alloys such as Sn—Cu—Ag alloys.

[Soluble Salt or Oxide (A) including at least Stannous Salt]

The soluble salt or oxide (A) including at least a stannous salt (simply referred to below as a soluble salt including a stannous salt) used in the tin alloy plating solution of the present embodiment is a salt that dissolves in water to produce divalent tin ions. Examples of soluble salts include halides, sulfates, oxides, alkane sulfonic acid salts having less than 9 carbon atoms, aryl sulfonic acid salts, and alkanol sulfonic acid salts. Specific examples of alkane sulfonic acid salts include metha ne sulfonic acid salts and ethane sulfonic acid salts. Specific examples of aryl sulfonic acid salts include benzene sulfonic acid salts, phenol sulfonic acid salts, cresol sulfonic acid salts, and toluene sulfonic acid salts. Specific examples of alkanol sulfonic acid salts include isethionic acid salts.

As the soluble salt (A) including at least a stannous salt (referred to below as soluble tin salt (A)), one kind may be used alone or a combination of two or more kinds may be used. The amount of the soluble tin salt (A) in the tin alloy plating solution of the present embodiment is preferably in a range of 5 g/L or more and 200 g/L or less and more preferably in a range of 20 g/L or more and 100 g/L or less in terms of the amount of tin. In a case where the amount of the soluble tin salt (A) is excessively low, normal tin precipitation becomes difficult to occur under a condition where a current density is in a range of 1 to 20 ASD (amperes per square decimeter) which is typically applied in bump plating and there is a concern that it may become impossible to form good bumps. On the other hand, in a case where the amount of the soluble tin salt (A) is excessively high, the viscosity of the plating solution increases; and thereby, it becomes impossible to form bumps and there is a concern that the cost of the plating bath will increase since tin is included more than necessary.

[Soluble Salt (B) of Metal Nobler than Tin]

The soluble salt or oxide (B) of a metal nobler than tin (referred to below as a soluble salt of a metal nobler than tin) used in the tin alloy plating solution of the present embodiment is a salt that dissolves in water. Examples of metals nobler than tin include at least one or more metals selected from silver, copper, gold, and bismuth. Examples of these soluble salts (B) of metals nobler than tin are the same as examples of soluble tin salts (A). Among these metals, it is preferable to include silver or copper. This is because the solder wettability, mounting strength, bendability, and reflowing property are excellent and the effect that whiskers are not easily generated is obtained. An alloy of tin and silver (Sn—Ag alloy) has a low melting point because the low melting point of the eutectic composition (Sn-3.5 mass % Ag) is 221° C. and an alloy of tin and copper (Sn—Cu alloy) has a low melting point because the low melting point of the eutectic composition (Sn-1.7 mass % Cu) is 227° C. and both have advantages such as that the solder wettability, mounting strength, bendability, and reflowing property are excellent and that whiskers are not easily generated. As the soluble salts (B) of metals nobler than tin, one kind may be used alone or a combination of two or more kinds may be used.

The amount of the soluble salt (B) of a metal nobler than tin in the plating solution of the present embodiment is preferably in a range of 0.01 g/L or more and 10 g/L or less and more preferably 0.1 g/L or more and 2 g/L or less in terms of the amount of metal. In a case where the amount of the soluble salt (B) of a metal nobler than tin is excessively small or excessively large, the composition of the precipitated solder alloy is not able to become a eutectic composition and characteristics as a solder alloy are not obtained.

[Leveling Agent (C)]

The leveling agent (C), which consists of alkane sulfonic acid including 9 to 18 carbon atoms in the molecule or a salt thereof, is added to form a uniform and dense plated film and smoothen the plated film, further improve the via filling property, and suppress the generation of voids. An alkane sulfonic acid including 9 to 18 carbon atoms in the molecule is represented by Formula (1) or Formula (2) and an alkane sulfonic acid salt including 9 to 18 carbon atoms in the molecule is represented by Formula (3) or Formula (4).

$$R^1\text{—}SO_3H \qquad (1)$$

$$R^2\text{—}HC(SO_3H)\text{—}R^3 \qquad (2)$$

$$R^1\text{—}SO_3Na \qquad (3)$$

$$R^2\text{—}HC(SO_3Na)\text{—}R^3 \qquad (4)$$

In Formula (1) and Formula (3), $R^1$ is an alkyl group and the number of carbon atoms of $R^1$ in the molecule (total number of carbon atoms in the molecule) is 9 to 18 and preferably 10 to 17. In addition, in Formula (2) and Formula (4), $R^2$ and $R^3$ are alkyl groups and the total number of carbon atoms in the molecule (total number of carbon atoms in the molecule) is 9 to 18 and preferably 10 to 17.

When an alkane sulfonic acid having a total number of carbon atoms of 8 or less in the molecule or a salt thereof is used, for example, when a methane sulfonic acid or an ethane sulfonic acid is used, the alkane sulfonic acid is highly water soluble and is not adsorbed to the surface of the object to be plated, thus, there is a problem in that the alkane sulfonic acid does not act as a leveling agent and the effect of smoothening the plated film is not obtained. In addition, when an alkane sulfonic acid having a total number of carbon atoms of 19 or more in the molecule or a salt thereof is used, the alkane sulfonic acid has low water solubility, and thus, there is a problem in that it is not possible to dissolve the alkane sulfonic acid in the plating solution.

The alkane sulfonic acid is preferably a primary alkane sulfonic acid, a secondary alkane sulfonic acid, or a salt thereof and the alkane sulfonic acid is more preferably a secondary alkane sulfonic acid or a salt thereof. The reason why it is more preferable to use a secondary alkane sulfonic acid or a salt thereof as the leveling agent (C) is as follows: the solubility in the plating solution is slightly higher than that of the primary alkane sulfonic acid or a salt thereof and an interaction quickly occurs that the non-ionic surfactant containing phenyl group solubilizes the alkane sulfonic acid or salt thereof in the plating solution. Examples of primary alkane sulfonic acids represented by Formula (1) include 1-nonane sulfonic acid, 1-decane sulfonic acid, 1-dodecyl sulfonic acid, 1-tetradecane sulfonic acid, 1-hexadecane sulfonic acid, 1-octadecane sulfonic acid, and the like. In addition, examples of the primary alkane sulfonic acid salts represented by Formula (3) include sodium 1-nonane sulfonate, potassium 1-decane sulfonate, sodium 1-dodecyl sulfonate, potassium 1-dodecyl sulfonate, potassium 1-tetradecane sulfonate, sodium 1-hexadecane sulfonate, sodium 1-octadecane sulfonate, and the like.

On the other hand, examples of secondary alkane sulfonic acids represented by Formula (2) include nonane-sec-sulfonic acid, dodecyl-sec-sulfonic acid, tetradecyl-sec-sulfonic acid, heptadecyl-sec-sulfonic acid, octadecane-sec-sulfonic acid, and the like. In addition, examples of secondary alkane sulfonic acid salts represented by Formula (4) include sodium nonane-sec-sulfonate, calcium dodecyl-sec-sulfonate, sodium tetradecyl-sec-sulfonate, potassium heptadecyl-sec-sulfonate, sodium octadecane-sec-sulfonate, and the like. The amount of the alkane sulfonic acid or salt thereof is preferably 0.01 g/L to 1 g/L and more preferably 0.02 g/L to 0.5 g/L. The reason why the preferable amount of the alkane sulfonic acid or salt thereof is limited to within a range of 0.01 g/L to 1 g/L is as follows: when the amount is less than 0.01 g/L, the effect of addition is not sufficient, and when the amount is more than 1 g/L, there is a concern that the smoothening of the plated film will be inhibited.

[Non-Ionic Surfactant (D) including one or more Phenyl Groups in Molecule]

A non-ionic surfactant (D) including one or more phenyl groups in the molecule (referred to below as a non-ionic surfactant containing phenyl group (D)) has an action of improving the affinity between the tin alloy plating solution and the object to be plated and an action of adsorbing to the surface of the plated film when the tin alloy plated film is formed to suppress the crystal growth of the tin alloy in the plated film and make the crystal fine so that the external appearance of the plated film is improved, the adhesion to the object to be plated is improved, the film thickness is made uniform, and the like.

Specific examples of the non-ionic surfactant containing phenyl group (D) include compounds obtained by subjecting 5 mol to 50 mol of ethylene oxide (EO) and/or propylene oxide (PO) to addition condensation with phenol, octylphenol, nonylphenol, dodecylphenol, bisphenol A, bisphenol B, bisphenol E, bisphenol F, cumylphenol, polystyrenated phenol, polystyrenated cresol, tribenzylphenol, β-naphthol, or the like. Two or more of these non-ionic surfactants containing phenyl group (D) may be mixed and used in combination.

In addition, the added amount of the non-ionic surfactant containing phenyl group (D) in the tin alloy plating solution of the present embodiment is in a range of 0.01 g/L or more and 50 g/L or less, preferably in a range of 0.1 g/L or more and 40 g/L or less, and more preferably in a range of 1 g/L or more and 30 g/L or less.

[Free Acid (E)]

Examples of the free acid (E) include hydrogen chloride, hydrogen bromide, sulfuric acid, alkane sulfonic acid (number of carbon atoms: 1 to 6), aryl sulfonic acid, and alkanol sulfonic acid. Specific examples of alkane sulfonic acids include methane sulfonic acids (number of carbon atoms: 1) and ethane sulfonic acids (number of carbon atoms: 2), but alkane sulfonic acids in which the number of carbon atoms is 7 or more and 18 or less used as the leveling agent (C) of the present embodiment are not used as the free acid (E). Specific examples of aryl sulfonic acids include benzene sulfonic acid, phenol sulfonic acid, cresol sulfonic acid, and toluene sulfonic acid. Specific examples of alkanol sulfonic acids include isethionic acid. The free acid (E) has an action of increasing the conductivity of the tin alloy plating solution. In addition, as the free acid (E) one kind may be used alone or a combination of two or more kinds may be used.

The amount of the free acid in the tin alloy plating solution of the present embodiment is preferably in a range of 5 g/L or more and 500 g/L or less and more preferably in a range of 30 g/L or more and 300 g/L or less.

[Additives]

The tin alloy plating solution of the present embodiment may further include additives such as an antioxidant, a complexing agent for tin, and a pH adjuster.

[Antioxidant]

It is possible for the tin alloy plating solution of the present embodiment to include an antioxidant as necessary. The antioxidant is intended to prevent oxidation of $Sn^{2+}$ in the tin alloy plating solution. Examples of antioxidants include ascorbic acid and a salt thereof, pyrogallol, hydroquinone, phloroglucinol, trihydroxybenzene, catechol, cresol sulfonic acid and a salt thereof, catechol sulfonic acid and a salt thereof, hydroquinone sulfonic acid and a salt thereof, and the like. For example, hydroquinone sulfonic acid or a salt thereof is preferable for an acidic bath and ascorbic acid or a salt thereof is preferable for a neutral bath.

In addition, as the antioxidants, one kind may be used alone or a combination of two or more kinds may be used.

The amount of antioxidant added to the tin alloy plating solution of the present embodiment is generally in a range of 0.01 g/L or more and 20 g/L or less, preferably in a range of 0.1 g/L or more and 10 g/L or less, and more preferably 0.1 g/L or more and 5 g/L or less.

[Complexing Agent for Tin]

It is possible to apply the tin alloy plating solution of the present embodiment to tin alloy plating baths of any pH range such as acidic, weakly acidic, and neutral. $Sn^{2+}$ ions are stable in strong acidity (pH<1), but tend to form white precipitates in acidity to near neutral (pH: 1 to 7). Therefore, in a case where the tin alloy plating solution of the present embodiment is applied to a near-neutral tin plating bath, it is preferable to add a complexing agent for tin for the purpose of stabilizing $Sn^{2+}$ ions.

As a complexing agent for tin, it is possible to use oxycarboxylic acid, polycarboxylic acid, and monocarboxylic acid. Specific examples thereof include gluconic acid, citric acid, glucoheptonic acid, gluconolactone, acetic acid, propionic acid, butyric acid, ascorbic acid, oxalic acid, malonic acid, succinic acid, glycolic acid, malic acid, tartaric acid, salts thereof, and the like. Gluconic acid, citric acid, glucoheptonic acid, gluconolactone, glucoheptolactone, salts thereof, and the like are preferable. In addition, polyamines and aminocarboxylic acids such as ethylenediamine, 3,6-dithia-1,8-octanediol, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethylethylenediaminetriacetic acid (HEDTA), triethylenetetraminehexaacetic acid (TTHA), ethylenedioxybis(ethylamine)-N,N,N',N' tetraacetic acid, mercaptotriazoles, mercaptotetrazoles, glycines, nitrilotrimethylphosphonic acid, and 1-hydroxyethane-1,1-diphosphonic acid, or salts thereof are also useful as complexing agents for tin.

As the complexing agent for tin, one kind may be used alone or a combination of two or more kinds may be used. The added amount of the complexing agent for tin in the tin alloy plating solution of the present embodiment is in a range of 0.01 g/L or more and 20 g/L or less and preferably in a range of 0.1 g/L or more and 10 g/L or less.

[pH Adjuster]

It is possible for the tin alloy plating solution of the present embodiment to include a pH adjuster as necessary. Examples of pH adjusters include various acids such as hydrochloric acid and sulfuric acid and various bases such as aqueous ammonia, potassium hydroxide, sodium hydroxide, and sodium hydrogen carbonate, and the like. In addition, as pH adjusters, monocarboxylic acids such as acetic acid and propionic acid, dicarboxylic acids such as boric acid, phosphoric acid, oxalic acid, and succinic acid, oxycarboxylic acids such as lactic acid and tartaric acid, and the like are also effective. The pH of the tin alloy plating solution is preferably in a range of 0 to 7.

It is possible to prepare the tin alloy plating solution of the present embodiment by mixing the soluble tin salt (A), the soluble salt (B) of a metal nobler than tin, the leveling agent (C) consisting of an alkane sulfonic acid including 9 to 18 carbon atoms in the molecule or a salt thereof, the non-ionic surfactant containing phenyl group (D), the free acid (E), other components (such as a tin complexing agent), and water. As water, it is possible to use ion-exchanged water, distilled water, or the like. By including the components described above in the tin alloy plating solution, it is possible to form a uniform and dense plated film and to smoothen the plated film without using an aromatic carbonyl compound (benzalacetone, cinnamic acid, cinnamaldehyde, benzaldehyde, and the like) as a leveling agent and without replenishing the leveling agent for a long period of time during electroplating.

As a method for forming a plated film using the plating solution of the present embodiment, electroplating is used as described above. The current density during the formation of the plated film by electroplating is in a range of 0.1 ASD or more and 100 ASD or less and preferably in a range of 0.5 ASD or more and 20 ASD or less. The liquid temperature is in a range of 10° C. or higher and 50° C. or lower and more preferably in a range of 20° C. or higher and 40° C. or lower.

EXAMPLES

Next, a detailed description will be given of Examples together with Comparative Examples.

Example 1

In a tin methane sulfonate aqueous solution, methane sulfonic acid as a free acid, 3,6-dithia-1,8-octanediol as a silver complexing agent, polyoxyethylene phenyl ether (obtained by subjecting 5 moles of ethylene oxide (EO) to addition condensation with phenol) as a non-ionic surfactant containing phenyl group, and sodium 1-nonane sulfonate as a leveling agent consisting of an alkane sulfonic acid or salt thereof were mixed and dissolved, and then a silver methane sulfonate solution was further added thereto and mixed. Finally, ion-exchanged water was added to prepare a Sn—Ag plating solution (tin alloy plating solution) having the following composition. The tin methane sulfonate aqueous solution was prepared by electrolyzing a metal tin plate in a methane sulfonic acid aqueous solution and the silver methane sulfonic acid aqueous solution was prepared by electrolyzing a metal silver plate in a methane sulfonic acid aqueous solution, respectively.

(Composition of Sn—Ag Plating Solution (Tin Alloy Plating Solution))

Tin methane sulfonate (as $Sn^{2+}$): 50 g/L
Silver methane sulfonate (as $Ag^+$): 0.5 g/L
3,6-dithia-1,8-octanediol (as a complexing agent for silver): 1 g/L
Methane sulfonic acid (as a free acid): 100 g/L
Polyoxyethylene phenyl ether (non-ionic surfactant containing phenyl group): 5 g/L
Sodium 1-nonane sulfonate (as a leveling agent consisting of alkane sulfonic acid salt): 1 g/L
Ion-exchanged water: remainder Examples 2 to 18 and Comparative Examples 1 to 7

A Sn—Ag plating solution (tin alloy plating solution) was prepared in the same manner as Example 1 except that the type and amount ratio of the non-ionic surfactant containing phenyl group and the type and amount ratio of the leveling agent consisting of alkane sulfonic acid or a salt thereof were changed as shown in Table 2. In the Sn—Ag plating solutions of Examples 2 to 9, 15, and 17 and Comparative Examples 2 to 7, the non-ionic surfactant containing phenyl group was obtained by subjecting ethylene oxide (EO) in the number of moles shown in Table 2 (the added number of moles of E0) to addition condensation, but propylene oxide (PO) was not added. In addition, in the Sn—Ag plating solutions of Examples 10 to 14, 16 and 18, the non-ionic surfactant containing phenyl group was obtained by subjecting both ethylene oxide (EO) and propylene oxide (PO) in the respective mole numbers shown in Table 2 (added number of moles of EO and added number of moles of PO) to addition condensation. Further, the non-ionic surfactants containing phenyl group shown in types A to 0 and the leveling agents consisting of alkane sulfonic acids or salts thereof shown in types A to S in Table 2 are shown in Table 1.

The "Formula" in the column of the alkane sulfonic acid or salt thereof in Table 2 is any one of Formulas (1) to (4).

$$R^1\text{—}SO_3H \tag{1}$$

$$R^2\text{—}HC(SO_3H)\text{—}R^3 \tag{2}$$

$$R^1\text{—}SO_3Na \tag{3}$$

$$R^2\text{—}HC(SO_3Na)\text{—}R^3 \tag{4}$$

$R^1$ in Formula (1) and Formula (3) and $R^2$ and $R^3$ in Formula (2) and Formula (4) are alkyl groups. In addition, the "amount ratio" in the column of the alkane sulfonic acid or salt thereof in Table 2 is the amount ratio of the alkane sulfonic acid or salt thereof when the amount of Sn—Ag plating solution is 100 mass %.

<Comparison Test 1>

Each of the Sn—Ag plating solution (tin alloy plating solution) of Examples 1 to 18 and Comparative Examples 1 to 7 was used as the electrolyte solution, a liquid temperature of the electrolyte solution was adjusted to 30° C., a silicon wafer (a resist film having a thickness of 50 μm was formed on the surface in a state where circular exposed portions having a diameter of 75 μm were remained in the center) was immersed in the electrolyte, and electroplating was carried out at a current density of 4 ASD to form bumps having a thickness of 40 μm on the circular exposed portions of the silicon wafer. Next, the resist was peeled off from the surface of the silicon wafer on which the bumps were formed using an organic solvent. Furthermore, using a laser microscope (manufactured by Olympus: OLS3000), the arithmetic mean surface roughness Ra of 10 μm squares near the centers of the tops of the bumps was calculated. A sample of which the Ra was less than 0.5 μm was evaluated as "good", a sample of which the Ra was 0.5 μm or more and less than 0.7 μm was evaluated as "acceptable", and a sample of which the Ra was 0.7 μm or more was evaluated as "unacceptable."

TABLE 1

| Classification | Non-ionic surfactant containing phenyl group | Alkane sulfonic acid or salt thereof |
|---|---|---|
| A | Polyoxyethylene phenyl ether | Sodium 1-nonane sulfonate |
| B | Polyoxyethylene cumyl phenyl ether | 1-decane sulfonic acid |
| C | Polyoxyethylene polystyrenated phenyl ether | Potassium 1-decane sulfonate |
| D | Polyoxyethylene bisphenol A ether | Sodium 1-dodecyl sulfonate |
| E | Polyoxyethylene polystyrenated cresol ether | Potassium 1-dodecyl sulfonate |
| F | Polyoxyethylene nonyl phenyl ether | 1-tetradecane sulfonic acid |
| G | Polyoxyethylene bisphenol F ether | Potassium 1-tetradecane sulfonate |
| H | Polyoxyethylene β naphthyl ether | Sodium 1-hexadecane sulfonate |
| I | Polyoxyethylene tribenzyl phenyl ether | Sodium 1-octadecane sulfonate |
| J | Polyoxyethylene polyoxypropylene polystyrenated phenyl ether | Nonane-sec-sulfonic acid |

TABLE 1-continued

| Classification | Non-ionic surfactant containing phenyl group | Alkane sulfonic acid or salt thereof |
|---|---|---|
| K | Polyoxyethylene polyoxypropylene phenyl ether | Potassium dodecyl-sec-sulfonate |
| L | Polyoxyethylene polyoxypropylene polystyrenated cresol ether | Sodium tetradecyl-sec-sulfonate |
| M | Polyoxyethylene polyoxypropylene bisphenol A ether | Potassium heptadecyl-sec-sulfonate |
| N | Polyoxyethylene polyoxypropylene dodecyl phenyl ether | Octadecane-sec-sulfonic acid |
| O | Polyoxyethylene polyoxypropylene glycol (no phenyl group) | Sodium 1-octane sulfonate |
| P | | 1-nonadecane sulfonic acid |
| Q | | Sodium octane-sec-sulfonate |
| R | | Potassium nonadecane-sec-sulfonate |
| S | | Sodium dodecylbenzene sulfonate |

TABLE 2

| | Non-ionic surfactant containing phenyl group | | | Alkane sulfonic acid or salt thereof | | | | Bump surface roughness | |
|---|---|---|---|---|---|---|---|---|---|
| | Type | EO addition mole number | PO addition mole number | Type | Formula | Total number of carbon atoms in molecule | Amount ratio (g/L) | Ra (μm) | Determination |
| Example 1 | A | 5 | 0 | A | (3) | 9 | 1 | 0.38 | Good |
| Example 2 | B | 10 | 0 | B | (1) | 10 | 0.7 | 0.32 | Good |
| Example 3 | C | 20 | 0 | C | (3) | 10 | 0.5 | 0.26 | Good |
| Example 4 | D | 10 | 0 | D | (3) | 12 | 0.2 | 0.16 | Good |
| Example 5 | E | 15 | 0 | E | (3) | 12 | 0.1 | 0.12 | Good |
| Example 6 | F | 15 | 0 | F | (1) | 14 | 0.1 | 0.43 | Good |
| Example 7 | G | 20 | 0 | G | (3) | 14 | 0.05 | 0.38 | Good |
| Example 8 | H | 10 | 0 | H | (3) | 16 | 0.02 | 0.21 | Good |
| Example 9 | I | 20 | 0 | I | (3) | 16 | 0.01 | 0.24 | Good |
| Example 10 | J | 50 | 30 | J | (2) | 9 | 1 | 0.35 | Good |
| Example 11 | K | 20 | 10 | K | (4) | 12 | 0.5 | 0.27 | Good |
| Example 12 | L | 20 | 0 | L | (4) | 14 | 0.1 | 0.35 | Good |
| Example 13 | M | 15 | 0 | M | (4) | 17 | 0.05 | 0.21 | Good |
| Example 14 | N | 10 | 10 | N | (2) | 18 | 0.01 | 0.46 | Good |
| Example 15 | B | 10 | 0 | D | (3) | 12 | 2 | 0.59 | Acceptable |
| Example 16 | M | 15 | 5 | F | (1) | 14 | 0.005 | 0.62 | Acceptable |
| Example 17 | H | 10 | 0 | M | (4) | 17 | 1.5 | 0.65 | Acceptable |
| Example 18 | L | 20 | 5 | L | (4) | 14 | 0.005 | 0.51 | Acceptable |
| Comparative Example 1 | O | No phenyl group | | D | (3) | 12 | 0.1 | 0.94 | Unacceptable |
| Comparative Example 2 | C | 20 | 0 | O | (3) | 8 | 1 | 0.79 | Unacceptable |
| Comparative Example 3 | B | 10 | 0 | P | (1) | 19 | 0.01 | 0.96 | Unacceptable |
| Comparative Example 4 | D | 10 | 0 | Q | (4) | 8 | 1 | 0.87 | Unacceptable |
| Comparative Example 5 | H | 10 | 0 | R | (4) | 19 | 0.01 | 0.81 | Unacceptable |
| Comparative Example 6 | E | 15 | 0 | S | — | — | 0.05 | 0.82 | Unacceptable |
| Comparative Example 7 | A | 5 | 0 | — | — | — | — | 1.02 | Unacceptable |

<Evaluation 1>

As is clear from Table 1 and Table 2, in Comparative Example 1, bumps were formed using a Sn—Ag plating solution including a non-ionic surfactant having no phenyl group. For this reason, the surface roughness Ra of the tops of the bumps was as large as 0.94 μm, which was unacceptable.

In Comparative Example 2, bumps were formed using a Sn—Ag plating solution including the alkane sulfonic acid salt, and the alkane sulfonic acid salt corresponded to Formula (3), but the total number of carbon atoms in the molecule of the alkane sulfonic acid salt was 8, which was less than the appropriate range (the total number of carbon atoms in the molecule: 9 to 18). For this reason, the surface roughness Ra of the tops of the bumps was as large as 0.79 μm, which was unacceptable.

In Comparative Example 3, bumps were formed using a Sn—Ag plating solution including the alkane sulfonic acid salt, and the alkane sulfonic acid corresponded to Formula (1), but the total number of carbon atoms in the molecule of the alkane sulfonic acid salt was 19, which was greater than the appropriate range (the total number of carbon atoms in the molecule: 9 to 18). For this reason, the surface roughness Ra of the tops of the bumps was as large as 0.96 μm, which was unacceptable.

In Comparative Example 4, bumps were formed using a Sn—Ag plating solution including the alkane sulfonic acid salt, and the alkane sulfonic acid salt corresponded to Formula (4), but the total number of carbon atoms in the molecule of the alkane sulfonic acid salt was 8, which was less than the appropriate range (the total number of carbon atoms in the molecule: 9 to 18). For this reason, the surface roughness Ra of the tops of the bumps was as large as 0.87 μm, which was unacceptable.

In Comparative Example 5, bumps were formed using a Sn—Ag plating solution including the alkane sulfonic acid salt, and the alkane sulfonic acid salt corresponded to Formula (4), but the total number of carbon atoms in the molecule of the alkane sulfonic acid salt was 19, which was greater than the appropriate range (the total number of carbon atoms in the molecule: 9 to 18). For this reason, the surface roughness Ra of the tops of the bumps was as large as 0.81 µm, which was unacceptable.

In Comparative Example 6, bumps were formed using a Sn—Ag plating solution including an alkane sulfonic acid salt that did not correspond to either Formula (3) or Formula (4). For this reason, the surface roughness Ra of the tops of the bumps was as large as 0.82 µm, which was unacceptable.

In Comparative Example 7, bumps were formed using a Sn—Ag plating solution that did not include an alkane sulfonic acid or salt thereof. For this reason, the surface roughness Ra of the tops of the bumps was as large as 1.02 µm, which was unacceptable.

On the other hand, in Examples 1 to 9, 15, and 16, bumps were formed using a Sn—Ag plating solution including alkane sulfonic acid or a salt thereof, the alkane sulfonic acid or salt thereof corresponded to Formula (1) or Formula (3), and the total number of carbon atoms in the molecule of the alkane sulfonic acid or salt thereof was 9 to 18, which was in the appropriate range (the total number of carbon atoms in the molecule: 9 to 18). For this reason, the surface roughness Ra of the tops of the bumps was as small as 0.12 µm to 0.62 µm, which was good or acceptable.

However, in Example 15, bumps were formed using a Sn—Ag plating solution in which the amount ratio of an alkane sulfonic acid salt was 2 g/L, which was greater than the preferable range (0.01 to 1 g/L). For this reason, the surface roughness Ra of the tops of the bumps was 0.59 µm, which was slightly large but acceptable.

In addition, in Example 16, bumps were formed using a Sn—Ag plating solution in which the amount ratio of the alkane sulfonic acid was 0.005 g/L, which was less than the preferable range (0.01 to 1 g/L). For this reason, the surface roughness Ra of the tops of the bumps was 0.62 µm, which was slightly large but acceptable.

On the other hand, in Examples 10 to 14, 17, and 18, bumps were formed using a Sn—Ag plating solution including alkane sulfonic acid or a salt thereof, the alkane sulfonic acid or salt thereof corresponded to Formula (2) or Formula (4), and the total number of carbon atoms in the molecule of the alkane sulfonic acid or salt thereof was 9 to 18, which was in the appropriate range (the total number of carbon atoms in the molecule: 9 to 18). For this reason, the surface roughness Ra of the tops of the bumps was as small as 0.21 µm to 0.65 µm, which was good or acceptable.

However, in Example 17, bumps were formed using a Sn—Ag plating solution in which the amount ratio of the alkane sulfonic acid salt was 1.5 g/L, which was greater than the preferable range (0.01 to 1 g/L). For this reason, the surface roughness Ra of the tops of the bumps was 0.65 µm, which was slightly large but acceptable.

In addition, in Example 18, bumps were formed using a Sn—Ag plating solution in which the amount ratio of the alkane sulfonic acid salt was 0.005 g/L, which was less than the preferable range (0.01 to 1 g/L). For this reason, the surface roughness Ra of the tops of the bumps was 0.51 µm, which was slightly large but acceptable.

Comparative Test 2

The external appearance of the bumps formed using the plating solutions of Example 3 and Comparative Example 2 was photographed with a scanning electron microscope. The results are shown in FIG. 1 and FIG. 2.

<Evaluation 2>

Figure 2:
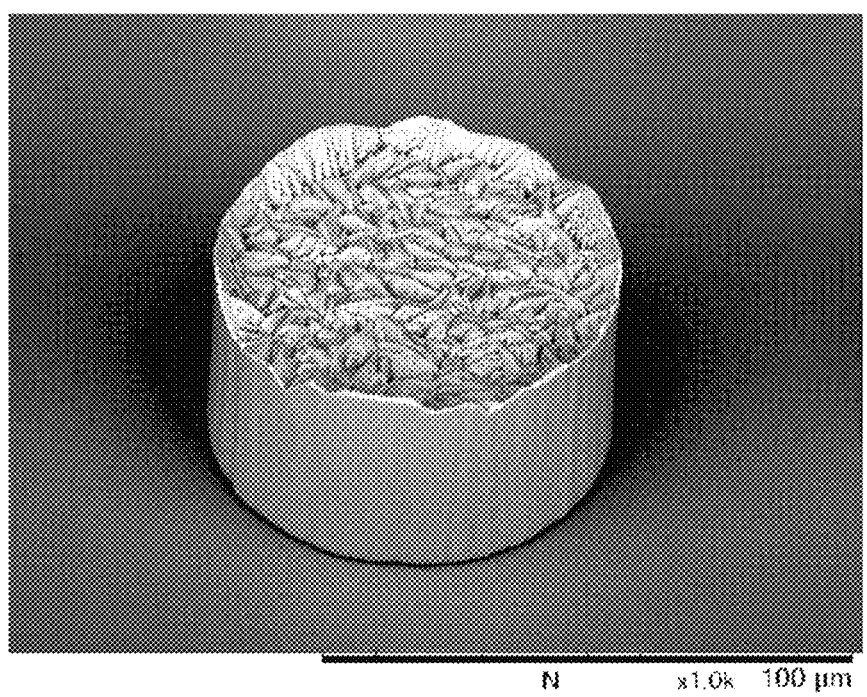
FIG. 2 is a scanning electron micrograph showing the external appearance of a bump of Comparative Example 2.

The surface roughness of the top of a bump formed using the plating solution of Comparative Example 2 was large, as is clear from FIG. 2, whereas the surface roughness of the top of a bump formed using the plating solution of Example 3 was small, as is clear from FIG. 1.

Industrial Applicability

It is possible to use the tin alloy plating solution of the present invention to form parts of electronic parts such as bump electrodes of semiconductor wafers and printed substrates.

What is claimed is:

1. A tin alloy plating solution comprising:
   (A) a soluble salt including at least a stannous salt;
   (B) a soluble salt of a metal nobler than tin;
   (C) a leveling agent consisting of an alkane sulfonic acid including 9 to 18 carbon atoms in a molecule or a salt thereof;
   (D) a non-ionic surfactant including one or more phenyl groups in a molecule; and
   (E) a free acid,
   wherein an amount of the soluble tin salt (A) is in a range of 5 g/L or more and 200 g/L or less in terms of an amount of tin,
   an amount of the soluble salt (B) of the metal nobler than tin is in a range of 0.01 g/L or more and 10 g/L or less in terms of an amount of the metal,
   an amount of the leveling agent (C) consisting of the alkane sulfonic acid or the salt thereof is in a range of 0.01 g/L to 1 g/L,
   an amount of the non-ionic surfactant (D) is in a range of 0.01 g/L or more and 50 g/L or less, and
   an amount of the free acid (E) is in a range of 5 g/L or more and 500 g/L or less.

2. The tin alloy plating solution according to claim 1, wherein the number of carbon atoms in the molecule of the alkane sulfonic acid or the salt thereof is 10 to 17.

3. The tin alloy plating solution according to claim 1, wherein the alkane sulfonic acid is a secondary alkane sulfonic acid or a salt thereof.

4. The tin alloy plating solution according to claim 1, wherein the metal nobler than tin is silver or copper.

* * * * *